United States Patent
Li et al.

(10) Patent No.: US 11,200,824 B2
(45) Date of Patent: Dec. 14, 2021

(54) SHIFT REGISTER UNIT, DRIVING METHOD THEREOF, GATE DRIVER CIRCUIT AND DISPLAY DEVICE

(71) Applicants: BOE TECHNOLOGY GROUP CO., LTD., Beijing (CN); Beijing BOE Optoelectronics Technology Co., Ltd., Beijing (CN)

(72) Inventors: Jinyu Li, Beijing (CN); Yue Li, Beijing (CN); Xi Chen, Beijing (CN); Yanchen Li, Beijing (CN); Xingyou Luo, Beijing (CN); Dawei Feng, Beijing (CN); Shaojun Hou, Beijing (CN); Dong Wang, Beijing (CN); Yu Zhao, Beijing (CN); Mingyang Lv, Beijing (CN); Wang Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 823 days.

(21) Appl. No.: 15/776,176

(22) PCT Filed: Sep. 22, 2017

(86) PCT No.: PCT/CN2017/102948
§ 371 (c)(1),
(2) Date: May 15, 2018

(87) PCT Pub. No.: WO2018/157587
PCT Pub. Date: Sep. 7, 2018

(65) Prior Publication Data
US 2021/0166595 A1 Jun. 3, 2021

Related U.S. Application Data

(63) Continuation of application No. PCT/CN2017/102948, filed on Sep. 22, 2017.

(30) Foreign Application Priority Data

Mar. 1, 2017 (CN) .......................... 201710117714.4

(51) Int. Cl.
G09G 3/20 (2006.01)
G11C 19/28 (2006.01)

(52) U.S. Cl.
CPC ............... *G09G 3/20* (2013.01); *G11C 19/28* (2013.01); *G09G 2310/0286* (2013.01)

(58) Field of Classification Search
CPC .................................. G09G 3/20; G11C 19/28
(Continued)

(56) References Cited

U.S. PATENT DOCUMENTS 7,528,820 B2    5/2009   Yoon et al.
8,994,629 B2    3/2015   Kim
(Continued)

FOREIGN PATENT DOCUMENTS

CN    1797509 A    7/2006
CN    103700333 A    4/2014
(Continued)

OTHER PUBLICATIONS

First Office Action for Chinese Patent Aoolication No. 201710117714.4 dated Dec. 28, 2017.
(Continued)

*Primary Examiner* — Prabodh M Dharia
(74) *Attorney, Agent, or Firm* — Calfee, Halter & Griswold LLP

(57) ABSTRACT

The present disclosure provides a shift register unit, a driving method thereof, a gate driver circuit and a display device. The shift register unit includes: a first input subcircuit configured to transmit a first voltage signal to a pull-up node under a control of a first input signal; an output
(Continued)

subcircuit configured to transmit a clock signal to a first output end and to transmit a second voltage signal to a second output end; a storage unit having a first end coupled to the pull-up node and a second end coupled to the first output end; a first pull-down subcircuit configured to pull down a voltage of the first output end and the second output end; and a second pull-down subcircuit configured to pull down a voltage of the first output end and the second output end.

14 Claims, 3 Drawing Sheets

(58) Field of Classification Search
USPC .................................................. 345/100, 204
See application file for complete search history.

(56) References Cited

U.S. PATENT DOCUMENTS

| | | | |
|---|---|---|---|
| 9,214,124 | B1 | 12/2015 | Yu et al. |
| 2006/0139292 | A1 | 6/2006 | Yoon et al. |
| 2014/0085285 | A1 | 3/2014 | Kim |
| 2015/0155052 | A1* | 6/2015 | Ma .......................... G11C 19/28 345/100 |
| 2015/0348484 | A1 | 12/2015 | Yu et al. |
| 2017/0018244 | A1 | 1/2017 | Jen et al. |
| 2018/0090090 | A1* | 3/2018 | Feng ..................... G09G 3/3674 |
| 2018/0336957 | A1* | 11/2018 | Mi ........................ G11C 19/287 |
| 2021/0166647 | A1* | 6/2021 | Zhao ...................... G11C 19/28 |

FOREIGN PATENT DOCUMENTS

| | | |
|---|---|---|
| CN | 103985369 A | 8/2014 |
| CN | 205028636 U | 2/2016 |
| CN | 105551422 A | 5/2016 |
| CN | 105957556 A | 9/2016 |
| CN | 106104664 A | 11/2016 |
| CN | 106340273 A | 1/2017 |
| CN | 106409213 A | 2/2017 |
| CN | 106448536 A | 2/2017 |
| CN | 106601208 A | 4/2017 |
| KR | 20140095209 A | 8/2014 |

OTHER PUBLICATIONS

Search Report for International Application No. PCT/CN2017/102948 dated Dec. 28, 2017.
Second Office Action for Chinese Patent Application No. 201710117714.4 dated Aug. 29, 2018.

* cited by examiner

SHIFT REGISTER UNIT, DRIVING METHOD THEREOF, GATE DRIVER CIRCUIT AND DISPLAY DEVICE

CROSS-REFERENCE

The present disclosure is the U.S. National Phase entry of PCT/CN2017/202948, filed on Sep. 22, 2017, which is based on and claims the priority of Chinese patent application No. 201710117714.4, which was filed with the SIPO on Mar. 1, 2017, the disclosures are fully incorporated herein by reference.

TECHNICAL FIELD

The present disclosure relates to the field of display technology, especially to a shift register unit, a driving method thereof, a gate driver circuit and a display device.

BACKGROUND

Liquid crystal display (LCD) is advantageous in small size, low power consumption, no radiation and low manufacturing cost, and hence plays a leading role in the market of flat-panel display (FPD). With the development of vehicle-mounted display technology, vehicle-mounted display devices have gradually become a significant constituent part in the field of display. The vehicle-mounted display technology, as one of high-end display applications, has extremely strict requirement on a reliability of display images.

A driving method adopted by the conventional LCD is to drive pixels on a display panel by utilizing a driver chip so as to display images and videos. However, the use of the driver chip means a complicated manufacturing process and expensive manufacturing cost. In recent years, in order to reduce the number of components as used and also the manufacturing cost, it's increasingly prevalent to directly manufacture a structure of driver circuit on the display panel, for example, by using a technology of integrating a gate driver circuit on the display panel (Gate on Array, GOA).

It should be explained that, the foregoing information disclosed in the BACKGROUND part is merely presented for enhancing the understanding to the background technology of the present disclosure, and hence may contain information which is not known for those ordinary skilled in the art.

SUMMARY

The objective of the present disclosure is to provide a shift register unit, a driving method thereof, a gate driver circuit and a display device.

Other aspects of the present disclosure will be more apparent from the following detailed description, or partly learned through practice of the present disclosure.

According to one aspect of the present disclosure, it provides a shift register unit, including:

a first input subcircuit that is coupled to a first input signal end, a first voltage signal end and a pull-up node, and is configured to transmit a first voltage signal to the pull-up node under a control of a first input signal;

an output subcircuit that is coupled to the pull-up node, a clock signal end, a second voltage signal end, a first output end and a second output end, and is configured to transmit a clock signal to the first output end under a control of the voltage signal of the pull-up node and to transmit a second voltage signal to the second output end;

a storage unit having a first end coupled to the pull-up node and a second end coupled to the first output end;

a first pull-down subcircuit that is coupled to a first control signal end, a third voltage signal end, the first output end and the second output end, and is configured to transmit a third voltage signal to the first output end and the second output end under a control of a first control signal; and a second pull-down subcircuit that is coupled to a second control signal end, the third voltage signal end, the first output end and the second output end, and is configured to transmit the third voltage signal to the first output end and the second output end under a control of a second control signal;

wherein the first control signal and the second control signal have a same frequency and opposite phases.

In an illustrative aspect of the present disclosure, the first control signal and the second control signal both change as the frame changes, and a period of each of the first control signal and the second control signal includes a time duration of two display frames.

In an illustrative aspect of the present disclosure, the second voltage signal is a direct current (DC) voltage signal.

In an illustrative aspect of the present disclosure, the shift register unit further includes:

a second input subcircuit which is coupled to a second input signal end, a fourth voltage signal end and the pull-up node, and is configured to transmit a fourth voltage signal to the pull-up node under a control of a second input signal;

wherein one of the first voltage signal and the fourth voltage signal is a high level signal, and the other one is a low level signal.

In an illustrative aspect of the present disclosure, the first input subcircuit includes:

a first switch element, having a control end coupled to the first input signal end, a first end coupled to the first voltage signal end, and a second end coupled to the pull-up node.

In an illustrative aspect of the present disclosure, the second input subcircuit includes:

a second switch element, having a control end coupled to the second input signal end, a first end coupled to the fourth voltage signal end, and a second end coupled to the pull-up node.

In an illustrative aspect of the present disclosure, the output subcircuit includes:

a third switch element, having a control end coupled to the pull-up node, a first end coupled to the clock signal end, and a second end coupled to the first output end;

a fourth switch element, having a control end coupled to the pull-up node, a first end coupled to the second voltage signal end, and a second end coupled to the second output end;

a fifth switch element, having a control end coupled to the pull-up node, a first end coupled to the third voltage signal end, and a second end coupled to a first pull-down node; and a sixth switch element, having a control end coupled to the pull-up node, a first end coupled to the third voltage signal end, and a second end coupled to a second pull-down node.

In an illustrative aspect of the present disclosure, the first pull-down subcircuit includes:

a seventh switch element, having a control end and a first end both coupled to the first control signal end, and a second end coupled to the first pull-down node;

an eighth switch element, having a control end coupled to the first pull-down node, a first end coupled to the third voltage signal end, and a second end coupled to the second pull-down node;

a ninth switch element, having a control end coupled to the first pull-down node, a first end coupled to the third voltage signal end, and a second end coupled to the pull-up node;

a tenth switch element, having a control end coupled to the first pull-down node, a first end coupled to the third voltage signal end, and a second end coupled to the first output end; and an eleventh switch element, having a control end coupled to the first pull-down node, a first end coupled to the third voltage signal end, and a second end coupled to the second output end.

In an illustrative aspect of the present disclosure, the second pull-down subcircuit includes:

a twelfth switch element, having a control end and a first end both coupled to the second control signal end, and a second end coupled to the second pull-down node;

a thirteenth switch element, having a control end coupled to the second pull-down node, a first end coupled to the third voltage signal end, and a second end coupled to the first pull-down node;

a fourteenth switch element, having a control end coupled to the second pull-down node, a first end coupled to the third voltage signal end, and a second end coupled to the pull-up node;

a fifteenth switch element, having a control end coupled to the second pull-down node, a first end coupled to the third voltage signal end, and a second end coupled to the first output end; and a sixteenth switch element, having a control end coupled to the second pull-down node, a first end coupled to the third voltage signal end, and a second end coupled to the second output end.

In an illustrative aspect of the present disclosure, each of the switch elements is an N-type thin film transistor (TFT) or a P-type TFT.

In an illustrative aspect of the present disclosure, a scanning mode of the shift register unit includes a forward scanning mode and a reverse scanning mode;

in the forward scanning mode, the first voltage signal is a high level signal, and the fourth voltage signal is a low level signal; and in the reverse scanning mode, the first voltage signal is a low level signal, and the fourth voltage signal is a high level signal.

According to another aspect of the present disclosure, it provides a gate driver circuit, including a plurality of the shift registers in cascaded connection;

wherein an output signal of a first output end of a $M^{th}$ stage of shift register unit is used as a first input signal of a $(M+1)^{th}$ stage of shift register unit; if the shift register unit further includes a second input module, then the output signal of the first output end of the $M^{th}$ stage of shift register unit is also used as a second input signal of a $(M-1)^{th}$ stage of shift register unit.

According to yet another aspect of the present disclosure, it provides a display device, including the above-mentioned gate driver circuit.

According to still yet another aspect of the present disclosure, it provides a driving method of a shift register unit, for driving the above-mentioned shift register unit; the driving method includes:

under a control of a first input signal, transmitting a first voltage signal to a pull-up node by a first input subcircuit to turn on an output subcircuit so that the output subcircuit transmits a clock signal to a first output end and transmits a second voltage signal to a second output end;

under a control of a second input signal, transmitting a fourth voltage signal to the pull-up node by a second input subcircuit to turn off the output module; and under a control of a first control signal or a second control signal, pulling down an output signal of the first output end or an output signal of the second output end by a first pull-down subcircuit or a second pull-down module.

It should be appreciated that, the general description above and detailed description below merely are provided for illustration and explanation, but not for limiting the present disclosure.

The present chapter provides a summary for various implementations or examples of technologies described in the present disclosure but not a full disclosure of all the scopes or features of the technologies as disclosed.

BRIEF DESCRIPTION OF THE DRAWINGS

The drawings that are provided herein and incorporated to the specification as a part thereof illustrate the embodiments in accordance with the present disclosure, for explaining the principles of the present disclosure in conjunction with the specification. Apparently, the drawings as described below merely are some embodiments of the present disclosure, from which other figures may be further obtained by those ordinary skilled in the art without paying any creative labor.

REFERENCE NUMERALS

Figure 1:
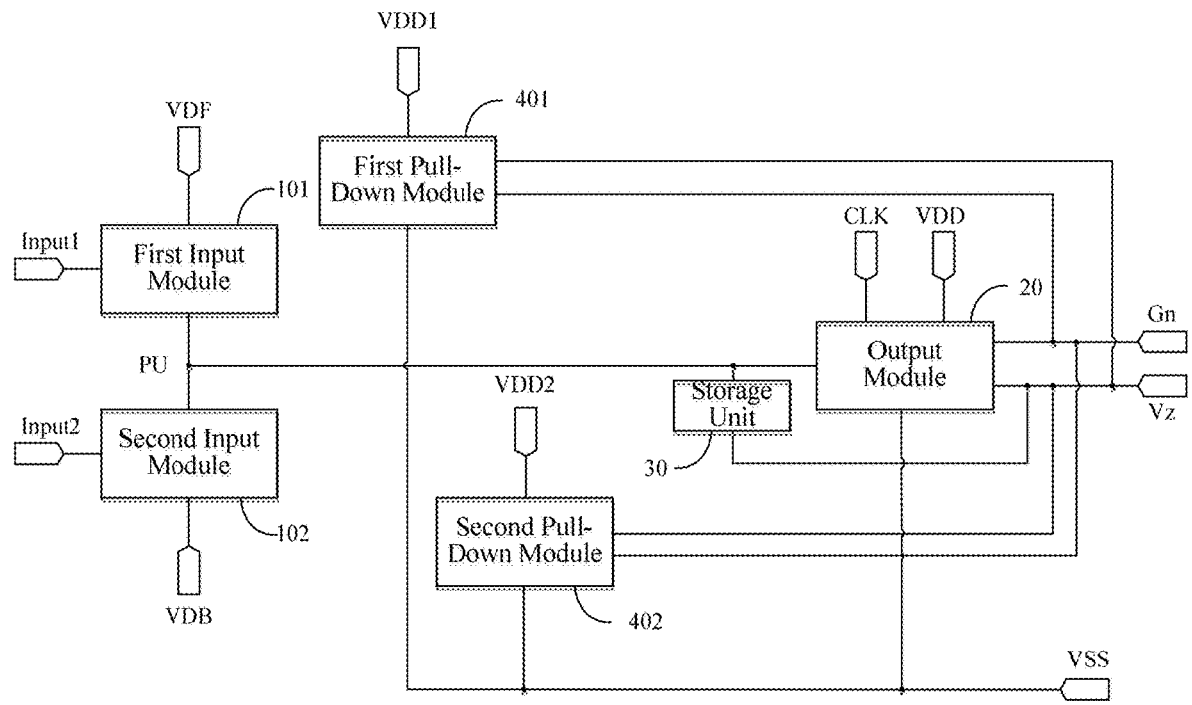
FIG. 1 illustrates a schematic diagram of modules in a shift register unit according to an aspect of the present disclosure.

Input1—first input signal end;
Input2—second input end;
CLK—clock signal end;
VDD1—first control signal end;
VDD2—second control signal end;
VDF—first voltage signal end;
VDD—second voltage signal end;
VSS—third voltage signal end;
VDB—fourth voltage signal end;
PU—pull-up node;
PD1—first pull-down node;
PD2—second pull-down node;
Vz—first output end; and
Gn—second output end.

DETAILED DESCRIPTION

Hereinafter, illustrative embodiments will be described more completely with reference to the drawings. However, these illustrative embodiments may be implemented by various ways and should not be construed to be limited to the examples set forth herein. Instead, these embodiments are provided for purpose of sufficiency and completeness of the contents disclosed by the present disclosure, so that the conception(s) of these illustrative embodiments can be well conveyed to those skilled in the art. The features, structures or properties as described may be combined into one or more embodiments in any proper way.

Moreover, the drawings are merely illustrative graphic representations and are not necessarily drawn in scales. Similar reference signs in the drawings indicate the same or similar portions and hence repeated description thereof will be omitted. Some block diagrams in the drawings are functional entities and are not necessarily corresponding to entities which are physically or logically independent. These functional entities may be implemented in a form of software, or may be implemented in one or more hardware subcircuit or integrated circuit, or may be implemented in different networks and/or processor devices and/or microcontroller devices.

The present illustrative aspect provides a shift register unit. As illustrated in FIG. 1, the shift register unit may include:

a first input subcircuit 101, which is coupled to a first input signal end Input1, a first voltage signal end VDF and a pull-up node PU, and is configured to transmit a first voltage signal to the pull-up node PU under a control of a first input signal;

an output subcircuit 20, which is coupled to the pull-up node PU, a clock signal end CLK, a second voltage signal end VDD, a first output end Vz and a second output end Gn, and is configured to transmit a clock signal to the first output end Vz and transmit a second voltage signal to the second output end Gn, under a control of the voltage signal of the pull-up node PU;

a storage unit 30, which has a first end coupled to the pull-up node PU and a second end coupled to the first output end Vz;

a first pull-down subcircuit 401, which is coupled to a first control signal end VDD1, a third voltage signal end VSS, the first output end Vz and the second output end Gn, and is configured to transmit a third voltage signal to the first output end Vz and the second output end Gn under a control of a first control signal, so as to pull down a voltage of the first output end Vz and a voltage of the second output end Gn; and a second pull-down subcircuit 402, which is coupled to a second control signal end VDD2, the third voltage signal end VSS, the first output end Vz and the second output end Gn, and is configured to transmit the third voltage signal to the first output end Vz and the second output end Gn under a control of a second control signal, so as to pull down the voltage of the first output end Vz and the voltage of the second output end Gn;

wherein the first control signal and the second control signal have a same frequency and opposite phases; that is, when the first control signal is a high level signal, the second control signal is a low level signal; when the first control signal is a low level signal, the second control signal is a high level signal.

It should be explained that, the output signal of the first output end Vz is an inter-stage transmission signal which may be used as an input signal of an adjacent stage of shift register unit; the output signal of the second output end Gn is a current-stage scanning signal which may be used as a scanning signal of the current stage of gate line.

The shift register unit provided by the present illustrative aspect utilizes two pull-down modules working in a time division mode under a control of different square signal, so as to effectively prevent devices from ageing due to long time operation, thereby improving a reliability of the shift register unit. In this way, when the shift register unit is applied in a gate driver circuit of a display device, a service life of the display device can be extended. The present disclosure is applicable for various display devices which have high requirements on the reliability, especially for vehicle-mounted display devices.

In the present illustrative embodiment, both of the first control signal and the second control signal can be varied with frame, and a period of each of the first control signal and the second control signal includes a time duration of two display frames. That is to say, in an $N^{th}$ frame period, the first control signal is a high level signal, and the second control signal is a low level signal; in a $(N+1)^{th}$ frame period, the first control signal is a low level signal, and the second control signal is a high level signal; and so on. The frame period refers to a time duration required by a single display frame.

In this way, the first control signal may control the first pull-down subcircuit 401 to work in the $N^{th}$ frame period, and the second control signal may control the second pull-down subcircuit 402 to work in the $(N+1)^{th}$ frame period, so as to achieve the effect of slowing down the ageing of the devices by allowing the two pull-down modules to work in a time division mode in adjacent frame periods.

In the present illustrative embodiment, the second voltage signal is a direct current (DC) voltage signal, particularly a DC high level signal. As compared with an alternating current (AC) voltage signal, the DC voltage signal would not generate any stray capacitance, and hence may provide a stable output at low power consumption and also reduce a noise of the output signal.

The shift register unit provided by the present illustrative aspect may further include: a second input subcircuit 102, which is coupled to a second input signal end Input2, a fourth voltage signal end VDB and the pull-up node PU, and is configured to transmit a fourth voltage signal to the pull-up node PU under a control of a second input signal.

One of the first voltage signal and the fourth voltage signal is a high level signal, and the other one is a low level signal. That is to say, when the first voltage signal is a high level signal, the fourth voltage signal is a low level signal; or, when the first voltage signal is a low level signal, the fourth voltage signal is a high level signal.

It can be seen from the above description that, a function of the first input subcircuit 101 and a function of the second input subcircuit 102 both are transmitting the input signal to the pull-up node PU, and are merely different in the input signal. On this basis, by controlling a level of the first voltage signal, a level of the fourth voltage signal, and an initial signal pulse, an effect of controlling a scanning sequence may be achieved. In this case, the first input subcircuit 101 and the second input subcircuit 102 may correspondingly be used as a trigger subcircuit and a reset module, respectively.

Figure 2:
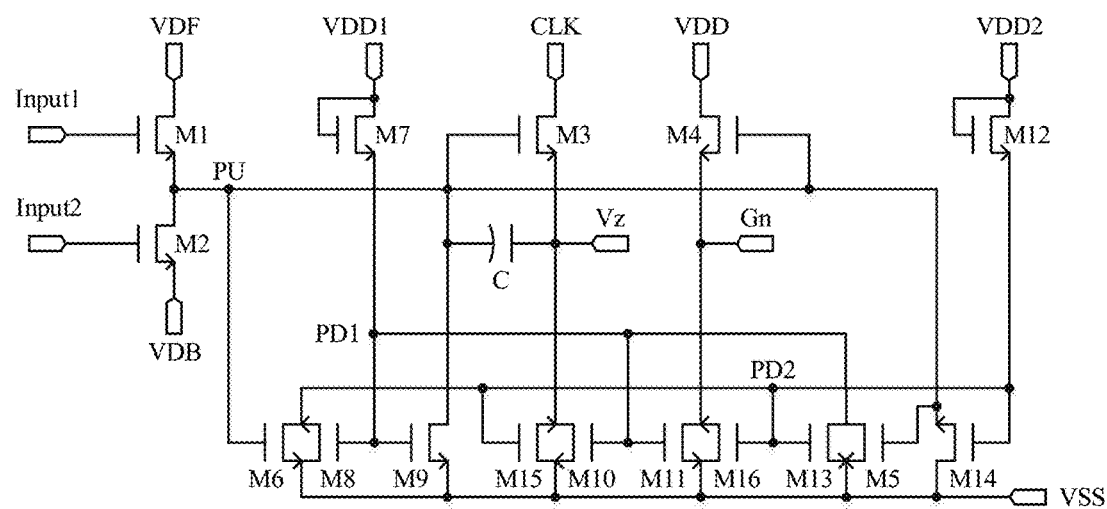
FIG. 2 illustrates a circuit diagram of a shift register unit according to an aspect of the present disclosure.

Hereinafter, a structure of the shift register unit will be specifically described in conjunction with FIG. 1 and FIG. 2.

The first input subcircuit 101 includes a first switch element M1, which is configured to be turned on in response to the first input signal so as to transmit the first voltage signal to the pull-up node PU.

The second input subcircuit 102 includes a second switch element M2, which is configured to be turned on in response to the second input signal so as to transmit the fourth voltage signal to the pull-up node PU.

The output subcircuit 20 includes: a third switch element M3, a fourth switch element M4, a fifth switch element M5 and a sixth switch element M6. The third switch element M3 is configured to be turned on in response to the voltage signal of the pull-up node PU so as to transmit the clock signal to the first output end Vz; the fourth switch element M4 is configured to be turned on in response to the voltage signal of the pull-up node PU so as to transmit the second voltage signal to the second output end Gn; the fifth switch element M5 is configured to be turned on in response to the voltage signal of the pull-up node PU so as to transmit the third voltage signal to the first pull-down node PD1; and the sixth switch element M6 is configured to be turned on in response to the voltage signal of the pull-up node PU so as to transmit the third voltage signal to the second pull-down node PD2.

The storage unit 30 is a storage capacitor C having a first end coupled to the pull-up node PU and a second end coupled to the first output end Vz.

The first pull-down subcircuit 401 includes: a seventh switch element M7, an eighth switch element M8, a ninth switch element M9, a tenth switch element M10 and an eleventh switch element M11. The seventh switch element M7 is configured to be turned on in response to the first control signal so as to transmit the first control signal to the first pull-down node PD1; the eighth switch element M8 is configured to be turned on in response to the voltage signal of the first pull-down node PD1 so as to transmit the third voltage signal to the second pull-down node PD2; the ninth switch element M9 is configured to be turned on in response to the voltage signal of the first pull-down node PD1 so as to transmit the third voltage signal to the pull-up node PU; the tenth switch element M10 is configured to be turned on in response to the voltage signal of the first pull-down node PD1 so as to transmit the third voltage signal to the first output end Vz; and the eleventh switch element M11 is configured to be turned on in response to the voltage signal of the first pull-down node PD1 so as to transmit the third voltage signal to the second output end Gn.

The second pull-down subcircuit 402 includes: a twelfth switch element M12, a thirteenth switch element M13, a fourteenth switch element M14, a fifteenth switch element M15 and a sixteenth switch element M16. The twelfth switch element M12 is configured to be turned on in response to the second control signal so as to transmit the second control signal to the second pull-down node PD2; the thirteenth switch element M13 is configured to be turned on in response to the voltage signal of the second pull-down node PD2 so as to transmit the third voltage signal to the first pull-down node PD1; the fourteenth switch element M14 is configured to be turned on in response to the voltage signal of the second pull-down node PD2 so as to transmit the third voltage signal to the pull-up node PU; the fifteenth switch element M15 is configured to be turned on in response to the voltage signal of the second pull-down node PD2 so as to transmit the third voltage signal to the first output end Vz; and the sixteenth switch element M16 is configured to be turned on in response to the voltage signal of the second pull-down node PD2 so as to transmit the third voltage signal to the second output end Gn.

The first control signal and the second control signal have a same frequency and opposite phases; one of the first voltage signal and the fourth voltage signal is a high level signal, and the other one is a low level signal; the second voltage signal is a DC high level signal, and the third voltage signal is a DC low level signal.

In the present illustrative embodiment, each of the switch elements may be turned on by a low level signal, for example, it may be a P-type thin film transistor (TFT); or each of the switch elements may be turned on by a high level signal, for example, it may be an N-type TFT. Herein, adopting transistors of the same type may facilitate simplifying the manufacturing process and reducing the manufacturing cost.

Figure 3:
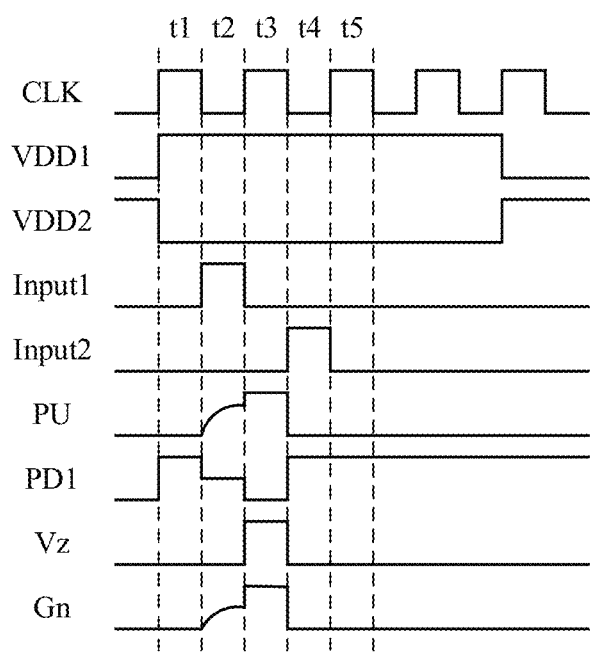
FIG. 3 illustrates waveform diagrams of various signals in a shift register unit according to an aspect of the present disclosure.

Hereinafter, a working process of a single shift register unit in a single frame period will be particularly described with reference to the case where each of the switch elements is an N-type switch tube and is turned on by a high level signal, by way of example, in conjunction with the shift register unit illustrated in FIG. 2 and the control signal waveform diagram illustrated in FIG. 3. The first voltage signal is at high level, the fourth voltage signal is at low level, the second voltage signal is at DC high level, and the third voltage signal is at DC low level.

During a first time period t1: both of the first input signal and the second input signal are at low level, the first control signal is at high level, the second control signal is at low level, the seventh switch element M7 is turned on to transmit the first control signal to the first pull-down node PD1, and then the first pull-down node PD1 is at high level; under the effect of the first pull-down node PD1, the eighth switch element M8 is turned on to transmit the third voltage signal to the second pull-down node PD2, the ninth switch element M9 is turned on to transmit the third voltage signal to the pull-up node PU, the tenth switch element M10 is turned on to transmit the third voltage signal to the first output end Vz, the eleventh switch element M11 is turned on to transmit the third voltage signal to the second output end Gn, and then the output signal of the first output end Vz and the output signal of the second output end Gn both are at low level.

During a second time period t2: the clock signal is at low level, the first input signal is at high level, the second input signal is at low level, the first switch element M1 is turned on to transmit the first voltage signal to the pull-up node PU to charge the pull-up node PU, and then the level of the pull-up node PU is raised; under the effect of the pull-up node PU, the fifth switch element M5 is turned on to pull down the voltage of the first pull-down node PD1, the sixth switch element M6 is turned on to pull down the voltage of the second pull-down node PD2, the third switch element M3 is turned on to transmit the clock signal to the first output end Vz, and then the output signal of the first output end Vz is at low level, the fourth switch element M4 is partially turned on (i.e., at a variable resistance zone) to transmit the second voltage signal to the second output end Gn, and then the output signal of the second output end Gn is gradually raised.

During a third time period t3: the clock signal is at high level, the first input signal and the second input signal both are at low level; since the pull-up node PU is charged at high level and stored in the storage capacitor C in the previous time point, the third switch element M3 is turned on to transmit the clock signal CKL at high level to the first output end Vz and cause the level of the pull-up node PU to be unceasingly raised through a bootstrap effect of the storage capacitor C, under the effect of the pull-up node PU; subsequently, the fourth switch element M4 is turned on to transmit the second voltage signal to the second output end Gn, and then the output signal of the first output end Vz and the output signal of the second output end Gn both are at high level; at the same time, the fifth switch element M5 and the sixth switch element M6 both are unceasingly turned on, and the first pull-down node PD1 and the second pull-down node PD2 both maintain at low level.

During a fourth time period t4: the clock signal is at low level, the first input signal is at low level, the second input signal is at high level, the second switch element M2 is turned on to transmit the fourth voltage signal to the pull-up node PU, and then the level of the pull-up node PU is pulled down; the first control signal is at high level, the seventh switch element M7 is turned on to transmit the first control signal to the first pull-down node PD1, and then the voltage signal of the first pull-down node PD1 is at high level; under the effect of the first pull-down node PD1, the eighth switch element M8 is turned on to transmit the third voltage signal to the second pull-down node PD2, the ninth switch element M9 is turned on to transmit the third voltage signal to the pull-up node PU, the tenth switch element M10 is turned on to transmit the third voltage signal to the first output end Vz, the eleventh switch element M11 is turned on to transmit the third voltage signal to the second output end Gn, and then the output signal of the first output end Vz and the output signal of the second output end Gn both are at low level.

During a fifth time period t5: the clock signal is at high level, the first input signal and the second input signal both are at low level, the first control signal is at high level, the seventh switch element M7 is turned on to transmit the first control signal to the first pull-down node PD1, and then the voltage signal of the first pull-down node PD1 is at high level; under the effect of the first pull-down node PD1, the ninth to eleventh switch elements M9-M11 maintain turned on, so as to stabilize the voltage of the pull-up node as well as the voltage of the first output end Vz and the voltage of the second output end Gn.

Based on the working sequence above, the shift register unit achieves the shift register function, and provides a stable output voltage.

It can be seen from the foregoing description that, during the above-mentioned one frame period, the switch element(s) coupled to the first pull-down node PD1 play(s) the role of controlling the pull-down of voltage; that is, the first pull-down subcircuit is at a working state while the second pull-down subcircuit is at an off-working state. On this basis, when it finishes scanning a single frame, a voltage amplitude of the first control signal and a voltage amplitude of the second control signal may be exchanged with each other; that is, the first control signal is at low level, the second control signal is at high level, and then the switch element(s) coupled to the second pull-down node PD2 play(s) the role of controlling the pull-down of voltage; that is, when the second pull-down subcircuit starts to work, the first pull-down subcircuit stops. It should be explained that, the second pull-down subcircuit and the first pull-down subcircuit function according to similar mechanism(s), without giving unnecessary details herein.

In this way, by utilizing two pull-down modules in a time division mode, the working period is about 50%, and then a working time of the switch element in each of the pull-down modules can be reduced by one time. When a sampling TFT is used as the switch element, a DC bias time of the TFT can also be reduced by one half. As a result, the service life of the transistor can be significantly increased.

In the foregoing embodiments, the switch elements adopt the same N-type transistors. Of course, those skilled in the art can easily conceive of the technical solution in which the switch elements in the shift register unit according to the present illustrative aspect all adopt P-type transistors; for example, when the first switch element M1 to the sixteenth switch element M16 are all P-type TFTs, all the switch elements are turned on by low level signal and the control ends thereof need to be input with low level signal during corresponding stage(s); as a result, the first voltage signal above is a low level voltage signal, and the fourth voltage signal above is a high level voltage signal. The shift register unit to be protected by the present disclosure is not limited to the implementations provided by the present embodiment, and may include simple variations made according to this shift register unit without giving unnecessary details herein.

On this basis, adopting transistors of the same channel type (that is, all the transistors are P-type TFTs) is further advantageous in that: for example, it can strongly resist the noise; for example, the P-type TFT is turned on by low level, which is relatively easier to be realized in terms of charging management; for example, the N-type TFT is liable to be affected by a ground bounce, while the P-type TFT will only be affected by a voltage drop at a driving voltage line (IR Drop), which is more easily to be eliminated; for example, the P-type TFT tube is simple in manufacturing process and cheaper in price; for example, the P-type TFT has better stability, and the like. As a result, by adopting the P-type TFT, it not only can reduce the complexity of the manufacturing process and the manufacturing cost but also facilitates improving the product quality.

In the present illustrative embodiment, a scanning mode of the shift register may include a forward scanning mode and a reverse scanning mode; the forward scanning mode refers to that each frame is scanned in a sequence from a first row to a last row, while the reverse scanning mode refers to that each frame is scanned in a sequence from a last row to a first row.

When the scanning mode is the forward scanning mode, an initial signal firstly triggers a first stage of shift register unit, then the first input subcircuit is used as a trigger subcircuit and the second input subcircuit is used as a reset module. When the scanning mode is the reverse scanning mode, the initial signal firstly triggers a last stage of shift register unit, then the first input subcircuit is used as the reset subcircuit and the second input subcircuit is used as the trigger module. It should be explained that, the first voltage signal and the fourth voltage signal in the forward scanning mode may be exchanged with each other in the reverse scanning mode. Thus it can be seen, the shift register unit in the present illustrative aspect is applicable for different scanning modes; and in practical application, it only needs to change the initial signal pulse (i.e., the shift register unit firstly triggered by the input signal), the first voltage signal and the fourth voltage signal.

Figure 4:
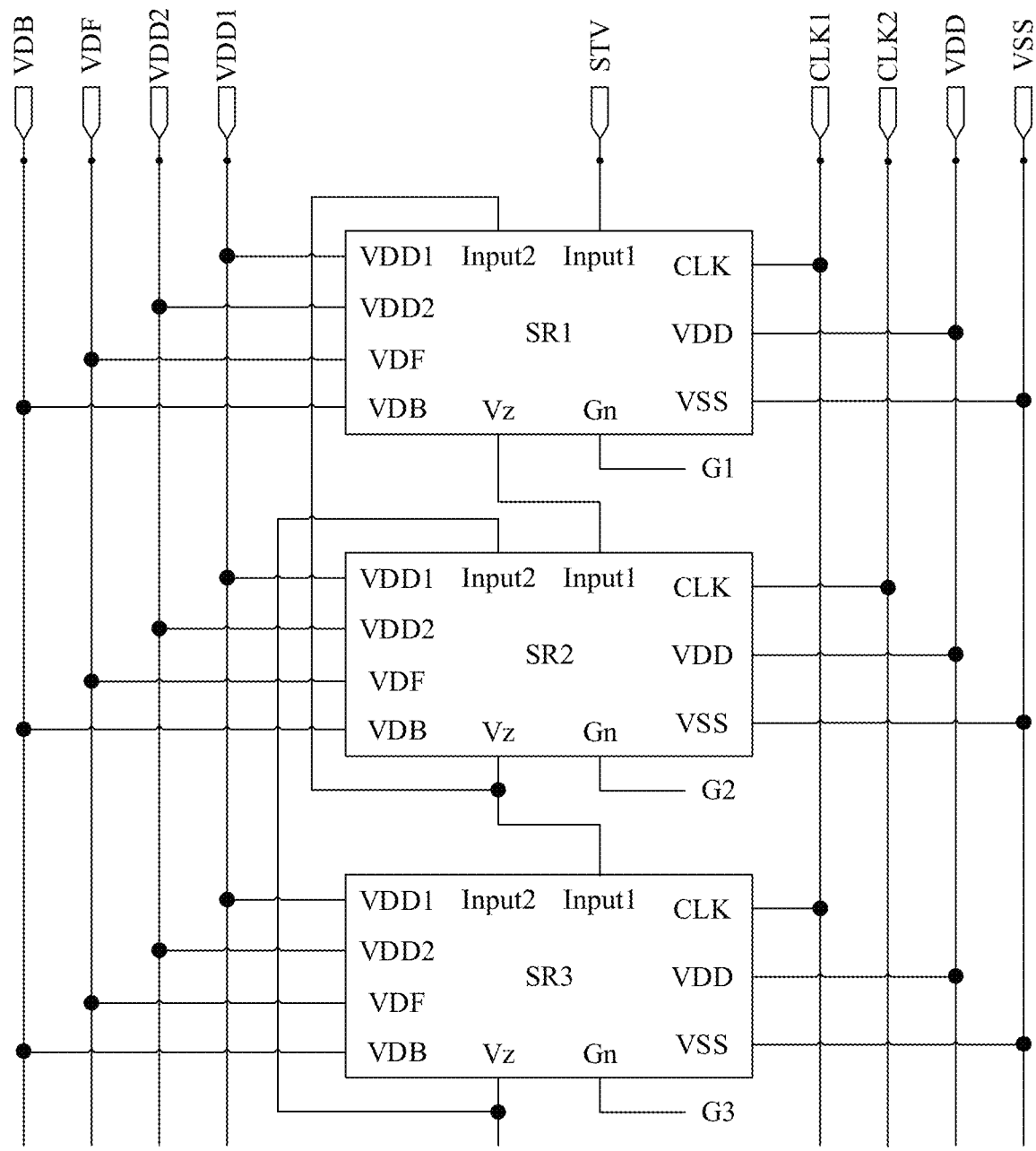
FIG. 4 illustrates a structural view of a gate driver circuit according to an aspect of the present disclosure.

The present illustrative aspect further provides a gate driver circuit. As illustrated in FIG. 4, the gate driver circuit includes a plurality of the above-mentioned shift register units in cascaded connection.

To be specific, the gate driver circuit may include N shift register units, including a first shift register unit SR1, a second shift register unit SR2, a third shift register unit SR3 and so on (other more shift register units are not illustrated). In the present illustrative embodiment, the output signal of the first output end Vz of a $M^{th}$ stage of shift register unit is used as the first input signal of a $(M+1)^{th}$ stage of shift register unit; and the output signal of the first output end Vz of the $M^{th}$ stage of shift register unit is also used as the second input signal of a $(M-1)^{th}$ stage of shift register unit; wherein $1<M<N$.

The present illustrative aspect further provides a display device including the above-mentioned gate driver circuit. The display device can extend the service life of the device, achieve stable output at low power consumption, and is applicable for display devices having high requirement on the reliability, for example, vehicle-mounted display devices.

The display device may be LCD, OLED (Organic Light Emitting Diode) display device, PLED (Polymer Light-Emitting Diode) display device, PDP (Plasma Display Panel) display device, and the like. The applicability of display devices will not be particularly limited herein.

It should be explained that, specific details of modules and units in the display device have been described particularly in the corresponding shift register circuit, and will not be repeated herein.

It should be noted that, although the foregoing description mentions several modules or units in the device for performing actions, such division of modules or units is not compulsory. Actually, according to the implementations of the present disclosure, features and functions of two or more modules or units described in the foregoing may be embodied in a single subcircuit or unit. On the contrary, the feature(s) and function(s) of a single subcircuit or unit described in the foregoing may be embodied in multiple modules or units by further division.

In addition, although various steps of the method in the present disclosure have been described in the drawings with a certain sequence, it's not intended to require or imply that these steps must be performed in such certain sequence or all these steps must be performed to obtain the desired result. Additionally or alternatively, certain steps may be omitted, multiple steps may be merged into a single step, and/or, a single step may be split into multiple steps, and the like.

From the foregoing description of the embodiments above, those skilled in the art should be appreciated that, the illustrative embodiments described herein may be implemented in software, or implemented in a combination of software with necessary hardware. Therefore, the technical solutions according to the embodiments of the present disclosure may be embodied in a form of software product which may be stored in a nonvolatile storage medium (e.g., CD-ROM, USB flash disk, mobile hard disk drive, and the like) or on a network, including several instructions which cause a computer device (e.g., personal computer, server, mobile terminal or network device, and the like) to perform the method according to the embodiments of the present disclosure.

The shift register unit and the driving method thereof as provided by the present illustrative aspect utilize two pull-down modules working in a time division mode under a control of different square signals, so as to effectively prevent devices from ageing due to long time operation, thereby improving a reliability of the shift register unit; in this way, when the shift register unit is applied in a gate driver circuit of a display device, a service life of the display device can be extended. The present disclosure is applicable for various display devices which have high requirements on reliability, especially for vehicle-mounted display devices.

By considering the specification and practicing the disclosure herein, those skilled in the art can easily conceive of other implementation(s) of the present disclosure. The present disclosure is intended to cover any variation(s), purpose(s) or adaptive modification(s) of the present disclosure, which is (are) in accordance with general principle(s) of the present disclosure and include common knowledge or conventional technical means in the present technical fields not disclosed in the present disclosure. The specification and the embodiments should be considered as illustrative, and the true scope and spirit of the present disclosure are indicated by the appended claims.

What is claimed is:

1. A shift register unit, comprising:
a first input subcircuit, coupled to a first input signal end, a first voltage signal end and a pull-up node, and configured to transmit a first voltage signal to the pull-up node under a control of a first input signal;
an output subcircuit, coupled to the pull-up node, a clock signal end, a second voltage signal end, a first output end and a second output end, and configured to transmit a clock signal to the first output end under a control of a voltage signal of the pull-up node and to transmit a second voltage signal to the second output end;
a storage unit, having a first end coupled to the pull-up node and a second end coupled to the first output end;
a first pull-down subcircuit, coupled to a first control signal end, a third voltage signal end, the first output end and the second output end, and configured to transmit a third voltage signal to the first output end and the second output end under a control of a first control signal; and
a second pull-down subcircuit, coupled to a second control signal end, the third voltage signal end, the first output end and the second output end, and configured to transmit the third voltage signal to the first output end and the second output end under a control of a second control signal,
wherein the first control signal and the second control signal have a same frequency and opposite phases, wherein the second voltage signal is a direct current (DC) voltage signal.

2. The shift register unit according to claim 1, wherein the first control signal and the second control signal both change as the frame changes, and a period of each of the first control signal and the second control signal comprises a time duration of two display frames.

3. The shift register unit according to claim 1, further comprising:
a second input subcircuit, coupled to a second input signal end, a fourth voltage signal end and the pull-up node, and configured to transmit a fourth voltage signal to the pull-up node under a control of a second input signal;
wherein one of the first voltage signal and the fourth voltage signal is a high level signal, and the other one is a low level signal.

4. The shift register unit according to claim 3, wherein the second input subcircuit comprises:
a second switch element, a control end of the second switch element being coupled to the second input signal end, a first end of the second switch element being coupled to the fourth voltage signal end, and a second end of the second switch element being coupled to the pull-up node.

5. The shift register unit according to claim 3, wherein a scanning mode of the shift register unit comprises a forward scanning mode and a reverse scanning mode;
in the forward scanning mode, the first voltage signal is a high level signal, and the fourth voltage signal is a low level signal; and
in the reverse scanning mode, the first voltage signal is a low level signal, and the fourth voltage signal is a high level signal.

6. The shift register unit according to claim 1, wherein the first input subcircuit comprises:
a first switch element, a control end of the first switch element being coupled to the first input signal end, a first end of the first switch element being coupled to the first voltage signal end, and a second end of the first switch element being coupled to the pull-up node.

7. The shift register unit according to claim 1, wherein the output subcircuit comprises:
a third switch element, a control end of the third switch element being coupled to the pull- up node, a first end of the third switch element being coupled to the clock signal end, and a second end of the third switch element being coupled to the first output end;
a fourth switch element, a control end of the fourth switch element being coupled to the pull-up node, a first end of the fourth switch element being coupled to the second voltage signal end, and a second end of the fourth switch element being coupled to the second output end;
a fifth switch element, a control end of the fifth switch element being coupled to the pull-up node, a first end of the fifth switch element being coupled to the third voltage signal end, and a second end of the fifth switch element being coupled to a first pull-down node; and
a sixth switch element, a control end of the sixth switch element being coupled to the pull-up node, a first end of the sixth switch element being coupled to the third voltage signal end, and a second end of the sixth switch element being coupled to a second pull-down node.

8. The shift register unit according to claim 7, wherein the first pull-down subcircuit comprises:
a seventh switch element, a control end and a first end of the seventh switch element being both coupled to the first control signal end, and a second end of the seventh switch element being coupled to the first pull-down node;
an eighth switch element, a control end of the eighth switch element being coupled to the first pull-down node, a first end of the eighth switch element being coupled to the third voltage signal end, and a second end of the eighth switch element being coupled to the second pull-down node;
a ninth switch element, a control end of the ninth switch element being coupled to the first pull-down node, a first end of the ninth switch element being coupled to the third voltage signal end, and a second end of the ninth switch element being coupled to the pull-up node;
a tenth switch element, a control end of the tenth switch element being coupled to the first pull-down node, a first end of the tenth switch element being coupled to the third voltage signal end, and a second end of the tenth switch element being coupled to the first output end; and
an eleventh switch element, a control end of the eleventh switch element being coupled to the first pull-down node, a first end of the eleventh switch element being coupled to the third voltage signal end, and a second end of the eleventh switch element being coupled to the second output end.

9. The shift register unit according to claim 7, wherein the second pull-down subcircuit comprises:
a twelfth switch element, a control end and a first end of the twelfth switch element being both coupled to the second control signal end, and a second end of the twelfth switch element being coupled to the second pull-down node;
a thirteenth switch element, a control end of the thirteenth switch element being coupled to the second pull-down node, a first end of the thirteenth switch element being coupled to the third voltage signal end, and a second end of the thirteenth switch element being coupled to the first pull-down node;
a fourteenth switch element, a control end of the fourteenth switch element being coupled to the second pull-down node, a first end of the fourteenth switch element being coupled to the third voltage signal end, and a second end of the fourteenth switch element being coupled to the pull-up node;
a fifteenth switch element, a control end of the fifteenth switch element being coupled to the second pull-down node, a first end of the fifteenth switch element being coupled to the third voltage signal end, and a second end of the fifteenth switch element being coupled to the first output end; and
a sixteenth switch element, a control end of the sixteenth switch element being coupled to the second pull-down node, a first end of the sixteenth switch element being coupled to the third voltage signal end, and a second end of the sixteenth switch element being coupled to the second output end.

10. The shift register unit according to claim 9, wherein each of the switch elements is an N-type thin film transistor (TFT) or a P-type TFT.

11. A gate driver circuit, comprising a plurality of the shift registers according to claim 1 in cascaded connection;
wherein an output signal of a first output end of a $M^{th}$ stage of shift register unit is used as a first input signal of a $(M+1)^{th}$ stage of shift register unit; and
if the shift register unit further comprises a second input module, then the output signal of the first output end of the $M^{th}$ stage of shift register unit is also used as a second input signal of a $(M-1)^{th}$ stage of shift register unit.

12. A display device, comprising the gate driver circuit according to claim 11.

13. A driving method of a shift register unit, for driving the shift register unit according to claim 1;
the driving method comprising:
under a control of a first input signal, transmitting a first voltage signal to a pull-up node by a first input subcircuit to turn on an output module, and transmitting a clock signal to a first output end and transmitting a second voltage signal to a second output end by an output module;
under a control of a second input signal, transmitting a fourth voltage signal to the pull-up node by a second input subcircuit to turn off the output module; and
under a control of a first control signal or a second control signal, pulling down an output signal of the first output end or an output signal of the second output end by a first pull-down subcircuit or a second pull-down module.

14. The driving method according to claim 13, wherein the step of transmitting the clock signal to the first output end and transmitting the second voltate signal to the second output end by the output subcircuit is performed based on the clock signal.

* * * * *